United States Patent
Oh et al.

(10) Patent No.: US 7,755,410 B2
(45) Date of Patent: Jul. 13, 2010

(54) SEMICONDUCTOR INTEGRATED CIRCUIT CAPABLE OF OVERCOMING CLOCK SIGNAL JITTER

(75) Inventors: Ic-Su Oh, Ichon (KR); Yong-Ju Kim, Ichon (KR); Sung-Woo Han, Ichon (KR); Hee-Woong Song, Ichon (KR); Hyung-Soo Kim, Ichon (KR); Tae-Jin Hwang, Ichon (KR); Hae-Rang Choi, Ichon (KR); Ji-Wang Lee, Ichon (KR); Jae-Min Jang, Ichon (KR); Chang-Kun Park, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/330,287

(22) Filed: Dec. 8, 2008

(65) Prior Publication Data

US 2009/0231007 A1  Sep. 17, 2009

(30) Foreign Application Priority Data

Mar. 12, 2008 (KR) ...................... 10-2008-0022764

(51) Int. Cl.
*G06F 1/04* (2006.01)
(52) U.S. Cl. ...................................... 327/291; 327/298
(58) Field of Classification Search ........................ None
See application file for complete search history.

(56) References Cited

U.S. PATENT DOCUMENTS

| | | | | |
|---|---|---|---|---|
| 5,270,698 A * | 12/1993 | Hoyle et al. | ............. | 340/815.9 |
| 6,184,664 B1 * | 2/2001 | Ponzetta | ...................... | 323/274 |
| 6,229,861 B1 | 5/2001 | Young | | |
| 6,362,609 B1 * | 3/2002 | Gailhard | ...................... | 323/280 |
| 6,378,080 B1 | 4/2002 | Anjo et al. | | |
| 6,600,692 B2 * | 7/2003 | Tanzawa | ...................... | 365/226 |
| 7,006,543 B2 * | 2/2006 | Self et al. | ................. | 372/38.02 |
| 7,042,274 B2 * | 5/2006 | Hazucha et al. | ............. | 327/534 |
| 7,081,782 B2 * | 7/2006 | Kizer et al. | ................... | 327/158 |
| 7,271,503 B2 * | 9/2007 | Nonaka | ........................ | 307/45 |
| 7,342,420 B2 * | 3/2008 | Isik et al. | ....................... | 326/86 |
| 7,451,414 B2 * | 11/2008 | Groos | ............................ | 716/5 |
| 2007/0133338 A1 | 6/2007 | Hoffmann | | |
| 2007/0247250 A1 * | 10/2007 | Taylor et al. | ................. | 331/185 |

FOREIGN PATENT DOCUMENTS

| KR | 1020000001016 A | 1/2000 |
|---|---|---|
| KR | 100604939 | 7/2006 |
| KR | 100623335 | 9/2006 |
| KR | 1020080017444 A | 2/2008 |

\* cited by examiner

*Primary Examiner*—Cassandra Cox
(74) *Attorney, Agent, or Firm*—Baker & McKenzie LLP

(57) ABSTRACT

A semiconductor integrated circuit includes a voltage supplying unit that supplies a first regulated voltage and a second regulated voltage by using a first reference voltage and a second reference voltage, respectively, and a clock buffer unit that supplies an output clock clocking within a range of the first regulated voltage and the second regulated voltage.

4 Claims, 5 Drawing Sheets

SEMICONDUCTOR INTEGRATED CIRCUIT CAPABLE OF OVERCOMING CLOCK SIGNAL JITTER

CROSS-REFERENCES TO RELATED APPLICATION

The present application claims priority under 35 U.S.C. §119(a) to Korean application number 10-2008-0022764, filed on Mar. 12, 2008, in the Korean Intellectual Property Office, which is incorporated herein by reference in its entirety as if set forth in full.

BACKGROUND

1. Technical Field

The embodiments described here relate to a semiconductor integrated circuit (IC) and, more particularly, a semiconductor IC that includes a clock buffer.

2. Related Art

Generally, a synchronous memory operates in synchronization with a clock signal. A high-speed synchronous memory, such as a double data rate (DDR) memory, employs a delay locked loop (DLL) circuit to delay or fix an external clock signal such that data adjustably synchronizes with the clock signal. For example, a clock tree unit receives a clock signal to relay the clock signal to data input/output (I/O) buffers and data I/O pins. However, as a clock distribution path of the clock tree unit is increased, the load of the clock signal increases due to the loading of circuits interposed between the clock tree unit and the data I/O pins. Thus, if a clocking range or a swing range of a clock signal is changed due to the variation of an external voltage, power noise (jitter) may occur in clock signals that passed through the clock tree unit. Accordingly, transmission of the clock signals to the clock tree unit must minimize the power noise to prevent inaccurate or false data from being sent to or received from a semiconductor memory.

SUMMARY

A semiconductor IC capable of overcoming clock signal jitter by regulating a swing range of the clock signal is described herein.

In one aspect, a semiconductor integrated circuit includes a voltage supplying unit that supplies a first regulated voltage and a second regulated voltage by using a first reference voltage and a second reference voltage, respectively, and a clock buffer unit that supplies an output clock clocking within a range of the first regulated voltage and the second regulated voltage.

In another aspect, a semiconductor integrated circuit includes a voltage supplying unit that supplies a first regulated voltage and a second regulated voltage, the first regulated voltage being regulated from an external supply voltage by a predetermined voltage, the second regulated voltage being regulated from a ground voltage by a predetermined voltage, and a clock buffer unit that buffers an input clock signal to apply the input clock signal as an output clock signal, wherein the output clock signal has a swing range of first and second levels corresponding to the first and second regulated voltages, respectively.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
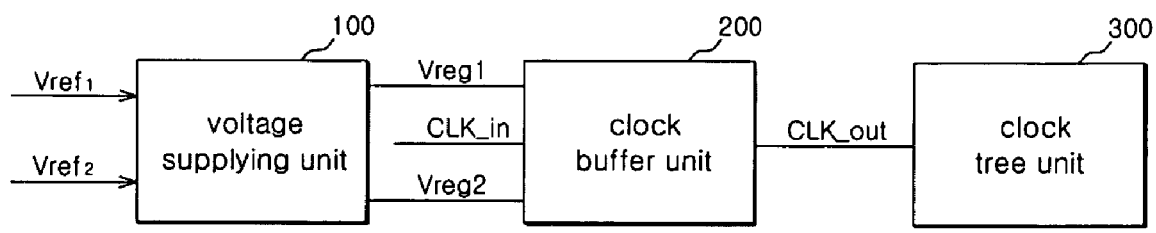
FIG. 1 is a schematic block diagram of an exemplary semiconductor IC according to one embodiment.

FIG. 1 is a schematic block diagram of an exemplary semiconductor IC according to one embodiment. Referring to FIG. 1, the semiconductor IC 1 can be configured to include a voltage supplying unit 100, a clock buffer unit 200, and a clock tree unit 300.

The voltage supplying unit 100 can supply a first regulated voltage Vreg1 in response to a first reference voltage Vref1, and can supply a second regulated voltage Vreg2 in response to a second reference voltage Vref2, wherein the first reference voltage Vref1 can be higher than the second reference voltage Vref2. Accordingly, the first regulated voltage Vreg1 can have a level lower than a level of an external supply voltage VDD by a predetermined amount. Similarly, the second regulated voltage Vreg2 can have a level higher than a level of a ground voltage VSS by a predetermined amount.

The clock buffer unit 200 can receive an input clock signal 'CLK_in' to supply an output clock signal 'CLK_out'. The first regulated voltage Vreg1 and the second regulated voltage Vreg2 can correspond to a high level and a low level that represent swing levels of the input and output clock signals 'CLK_in' and 'CLK_out'.

The clock tree unit 300 can receive the output clock signal 'CLK_out' to distribute and transmit the output clock signal 'CLK_out' to data input/output buffers (not shown) and data input/output pins (not shown). Since the output clock signal 'CLK_out' can be clocked with the swing levels, noise margins of the output clock signal 'CLK_out' transmitted by the clock tree unit 300 can be reduced.

Figure 2:
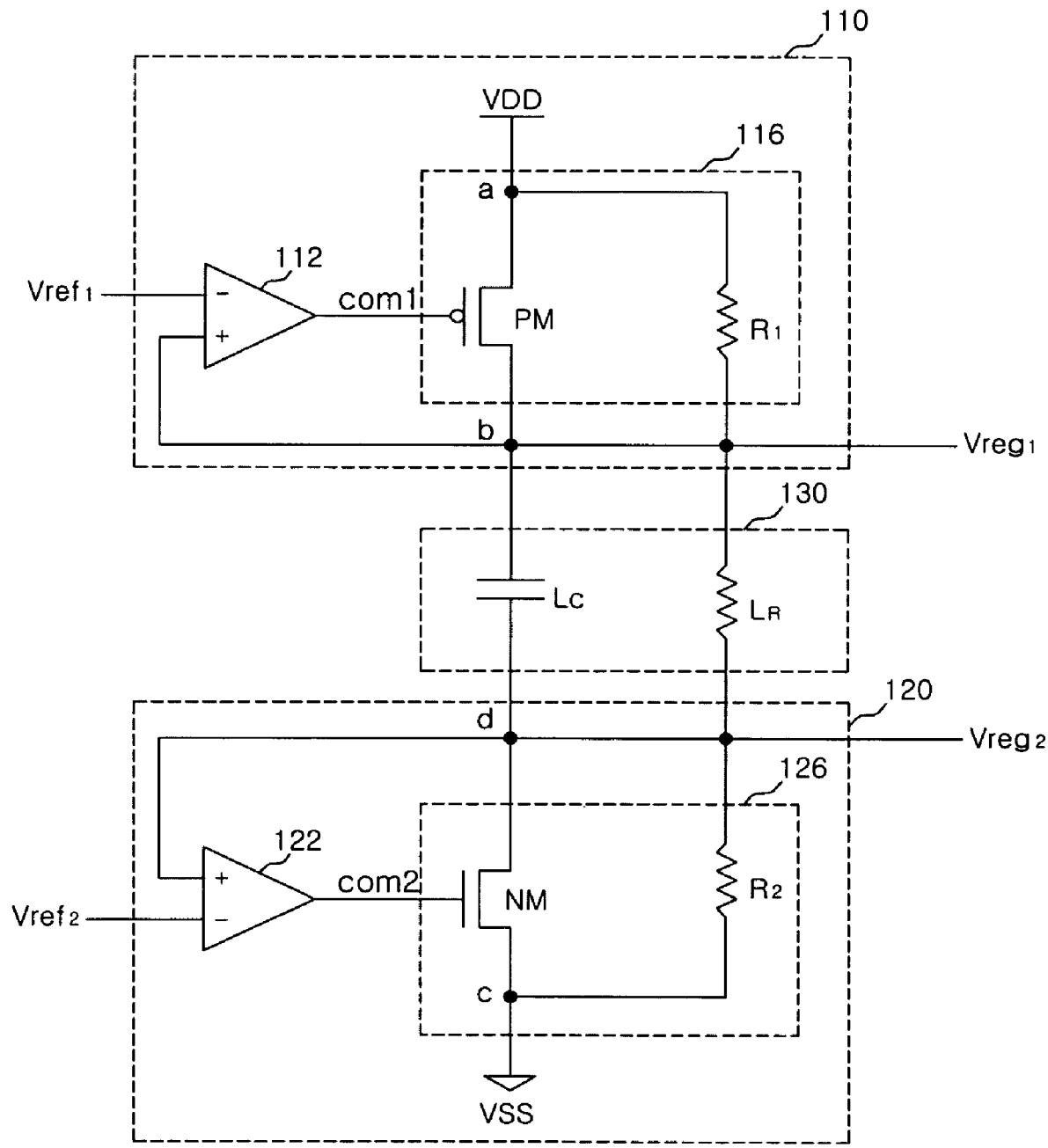
FIG. 2 is a schematic circuit diagram of an exemplary voltage supplying unit that can be included in the IC of FIG. 1 according to one embodiment.

FIG. 2 is a schematic circuit diagram of an exemplary voltage supplying unit of FIG. 1 according to one embodiment. Referring to FIG. 2, the voltage supplying unit 100 can be configured to include a first regulator 110, a second regulator 120, and a load unit 130. The first regulator 110 can provide the first regulated voltage Vreg1 in response to the first reference voltage Vref1.

The first regulator 110 can include a first comparator 112 and a first optimizer 116 to compare the first reference voltage Vref1 with the first regulated voltage Vreg1, which has been fed back. First regulator 110 can also perform voltage regulation by a predetermined voltage divided by the first optimizer 116 to provide the first regulated voltage Vreg1 having a level substantially identical to that of the first reference voltage Vref1. For example, the first comparator 112 can provide a first comparative signal 'com1' to the first optimizer 116, in which the first comparative signal 'com1' is obtained by comparing the first reference voltage Vref1 with the first regulated voltage Vreg1.

The first optimizer 116 can include a PMOS transistor PM, which can be a driving transistor, and a first resistor R1. The PMOS transistor PM can include a gate terminal for receiving the first comparative signal 'com1', a source terminal for receiving the external supply voltage VDD, and a drain terminal connected to a node 'b'. Here, the first resistor R1 can be connected to the PMOS transistor PM in parallel.

The second regulator 120 can include a second comparator 122 and a second optimizer 126. The second regulator 120 can compare the second reference voltage Vref2 with the second regulated voltage Vreg2, which has been fed back, and can perform voltage regulation by a voltage divided by the second optimizer 126 to provide the second regulated voltage Vreg2 substantially identical to the second reference voltage Vref2. The second comparator 122 can provide a second comparative signal 'com2' to the second optimizer 126, in which the comparative signal 'com2' can be obtained by comparing the second reference voltage Vref2 with the second regulated voltage Vreg2.

The second optimizer 126 can include an NMOS transistor NM which can be a driving transistor, and a second resistor R2. The NMOS transistor NM can include a gate terminal for receiving an output signal of the second comparator 122, a source terminal for receiving the ground voltage VSS, and a drain terminal connected to a node 'd'. Here, the second resistor R2 can be connected to the NMOS transistor NM in parallel.

In FIG. 2, the load unit 130 can be commonly connected to output terminals of the first and second regulators 110 and 120, and can include a load capacitor $L_C$ and a load resistor $L_R$. The load unit 130 can predict the load of an internal circuit unit by using the input and output clock signals 'CLK_in' and 'CLK_out' so that a load current constantly flows in the first and second regulators 110 and 120. Accordingly, the first and second regulators 110 and 120 can output stable signals when a clock signal is actually used due to the load unit 130.

An exemplary operation of the first regulator 110 will be described.

The comparator 112 can compare the first reference voltage Vref1 with the first regulated voltage Vreg1. If the first regulated voltage Vreg1 has a level lower than a level of the first reference voltage Vref1, then the comparator 112 can output the first comparative signal 'com1' having a low level. Accordingly, the PMOS transistor PM having received the first comparative signal 'com1' having the low level can be turned ON. Even through the PMOS transistor PM can be turned ON, a voltage drop occurs due to a voltage division caused by the first resistor R1. Thus, the node 'b' can output a voltage reduced from the supply voltage VDD by the voltage divided through the first resistor R1.

If the first regulated voltage Vreg1 has a level higher than a level of the first reference voltage Vref1, then the first comparative signal 'com1' can be output having a high level. Accordingly, the PMOS transistors PM having received the first comparative signal 'com1' having the high level can be turned OFF. Thus, the first regulated voltage Vreg1, which is an input signal, may be output with a voltage level reduced by a voltage divided through the first resistor R1. Accordingly, the first regulated voltage Vreg1 can be output with a voltage level substantially identical to that of the first reference voltage Vref1.

The first regulator 110 can output the first regulated voltage Vreg1 having a level substantially identical to a level of the first reference voltage Vref1. The first regulated voltage Vreg1 can have a level lower than a level of the external supply voltage VDD by a predetermine level. For example, if the external supply voltage VDD is about 1.5V, then the first regulated voltage Vreg1 can be about 1.35V. However, the present embodiment is not limited thereto. Specifically, it is preferred that a voltage difference between the external supply voltage VDD and the first regulated voltage Vreg1 is lower than a threshold voltage of the PMOS transistor PM.

An exemplary operation of the second regulator 120 will be described. Since the second regulator 120 can perform substantially the same operation as the operation of the first regulator 110, the details thereof will be made in brief.

The second comparator 122 can compare the second reference voltage Vref2 with the second regulated voltage Vreg2, wherein the second regulated voltage Vreg2 can have a level substantially identical to that of the second reference voltage Vref2. Voltage regulation can be performed by a predetermined voltage divided by the NMOS transistor NM and the second resistor R2 of the second regulator 126 according to the comparative result of the second comparator 122. Accordingly, when the NMOS transistor NM is turned ON, the second regulated voltage Vreg2 can be boosted from the ground voltage VSS by a predetermined voltage. For example, if the ground voltage VSS is about 0V, then the second regulated voltage Vreg2 can be about 0.15V. However, the present embodiment is not limited thereto. Specifically, it is preferred that the voltage difference between the ground voltage VSS and the second regulated voltage Vreg2 is lower than a threshold voltage of the NMOS transistor NM.

Accordingly, the voltage supplying unit 100 can supply the first regulated voltage Vreg1 reduced from the external supply voltage VDD by a predetermined voltage, and provide the second regulated voltage Vreg2 boosted from the ground voltage VSS by a predetermined voltage.

Figure 3:
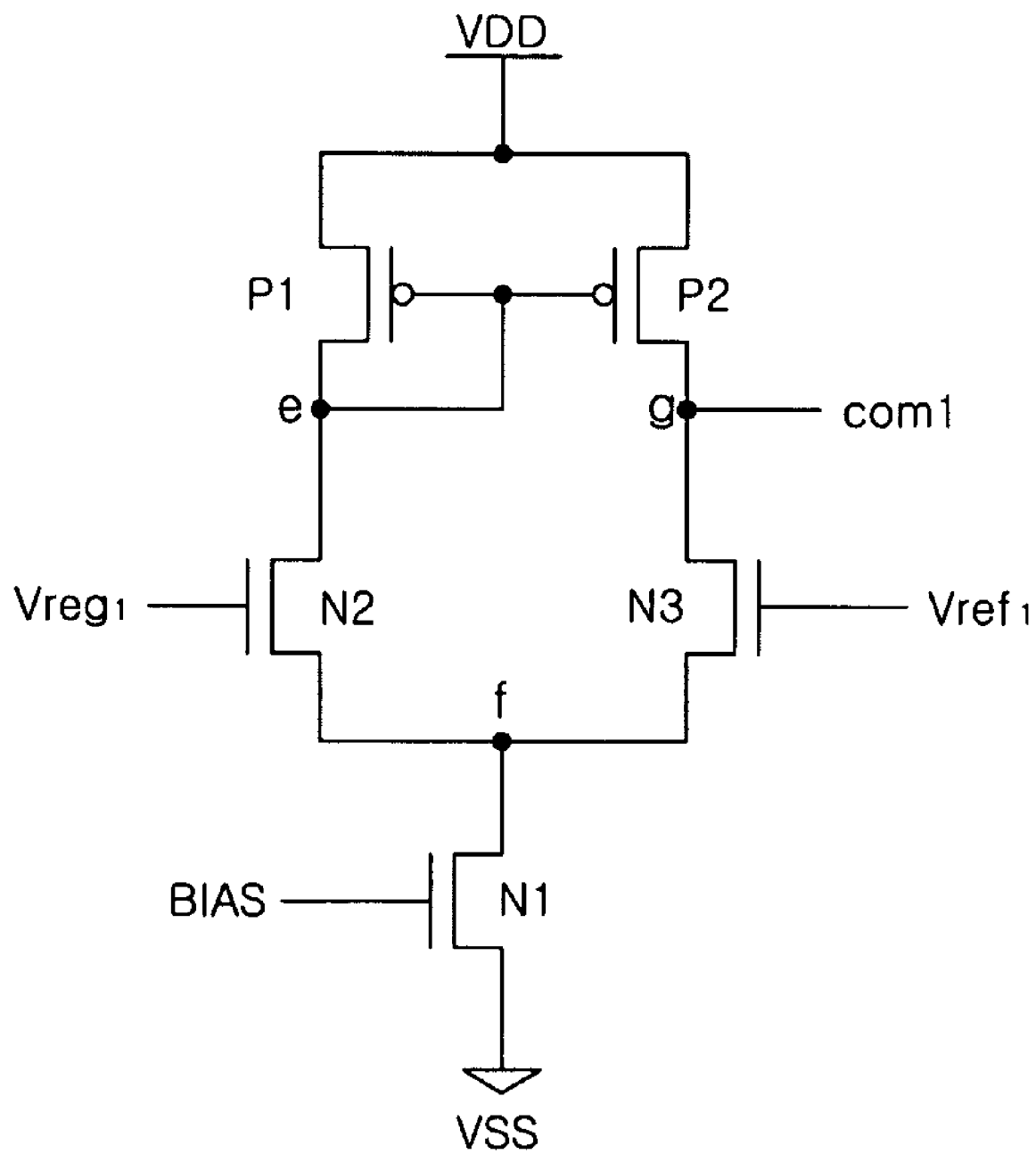
FIG. 3 is a schematic circuit diagram of an exemplary first comparator that can be included in the unit of FIG. 2 according to one embodiment.

FIG. 3 is a schematic circuit diagram of an exemplary first comparator of FIG. 2 according to one embodiment. Since the second comparator 122 (of FIG. 2) can have a structure and an operation substantially identical to those of the first comparator 112, except for the input of the second reference voltage Vref2, only the details of the first comparator 112 will be described below. Of course, the details of the first comparator 112 can be equally applied to the second comparator 122.

Referring to FIG. 3, the first comparator 112 can be configured to include first and second PMOS transistors P1 and P2, and first to third NMOS transistors N1 to N3. The first NMOS transistor N1 can be turned ON in response to a biasing signal 'BIAS', and can include a gate terminal for receiving the biasing signal 'BIAS', a source terminal for receiving the ground voltage VSS, and a drain terminal connected to a node 'f'.

The second and third NMOS transistors N2 and N3 can be turned ON in response to the first regulated voltage Vreg1 and the first reference voltage Vref1, respectively. The second NMOS transistor N2 can include a gate terminal for receiving the first regulated voltage Vreg1, a drain terminal connected to a node 'e', and a source terminal connected to the node 'f'. The third NMOS transistor N3 can include a gate terminal for receiving the first reference voltage Vref1, a drain terminal connected to a node 'g', and a source terminal connected to the node 'f'.

The first and second PMOS transistors P1 and P2 include gate terminals commonly connected to the node 'e', and source terminals commonly receiving the external supply voltage VDD. The first PMOS transistor P1 can include a drain terminal connected to the node 'e', and the second PMOS transistor P2 can include a drain terminal connected to the node 'g'.

In FIG. 3, the first comparator 112 can compare received input signals with each other. Here, the first comparator 112 can determine if the first reference voltage Vref1 is higher than or lower than the first regulated voltage Vreg1 through a comparison operation to provide the first comparative signal 'com1'. For example, if the first regulated voltage Vreg1 is higher than the first reference voltage Vref1, then the second NMOS transistor N2 can be turned ON. Accordingly, since the voltage level of the node 'e' is reduced, the second PMOS transistor P2 can be slightly turned ON. As a result, the first comparative signal 'com1' having a high level can be output. However, if the first regulated voltage Vreg1 is lower than the first reference voltage Vref1, then the third NMOS transistor N3 may be turned ON. Accordingly, since the voltage level of the node 'g' is reduced, the first comparative signal 'com1' having a low level can be output.

Figure 4:
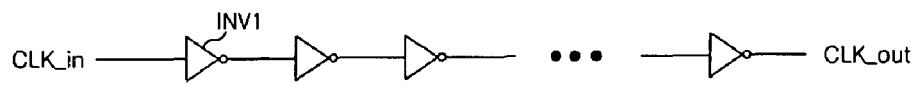
FIG. 4 is a schematic circuit diagram of an exemplary clock buffer unit that can be included in the IC of FIG. 1 according to one embodiment.
Figure 5:
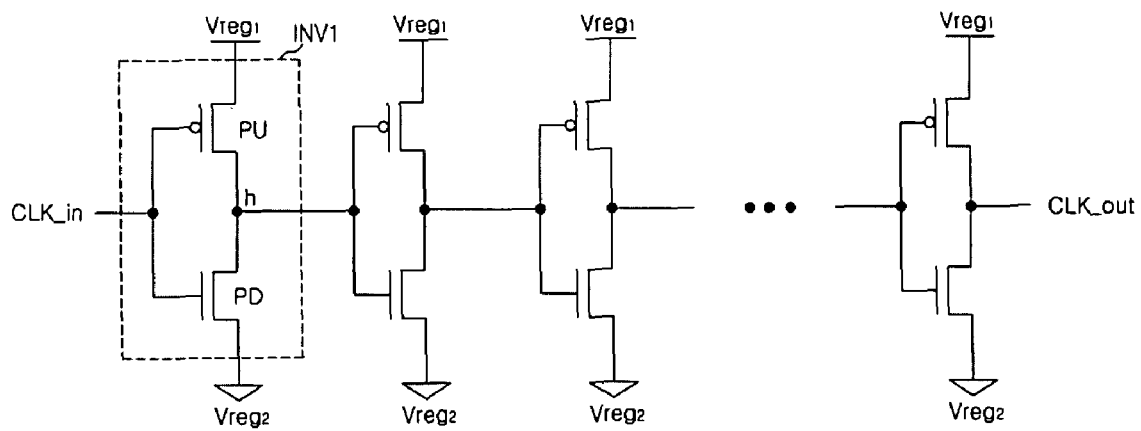
FIG. 5 is a schematic circuit diagram of an exemplary clock buffer unit of FIG. 4 according to one embodiment.

FIG. 4 is a schematic circuit diagram of an exemplary clock buffer unit of FIG. 1 according to one embodiment, and FIG. 5 is a schematic circuit diagram of an exemplary clock buffer unit of FIG. 4 according to one embodiment. Referring to FIGS. 4 and 5, the clock buffer unit 200 can include a plurality of inverters connected to each other in series.

The clock buffer unit 200 can be configured to receive the input clock signal 'CLK_in', and perform a buffering operation through a plurality of inverters. Then, the clock buffer unit 200 can provide the output clock signal 'CLK_out'.

In FIGS. 4 and 5, the first inverter INV1 can includes a pull-up element PU and a pull-down element PD. For example, the pull-up element PU can be a PMOS transistor, and can include a gate terminal for receiving the input clock signal 'CLK_in', a source terminal for receiving the first regulated voltage Vreg1, and a drain terminal connected to a node 'h'. In addition, the pull-down element PD can be an NMOS transistor that can include a gate terminal for receiving the input clock signal 'CLK_in', a source terminal for receiving the second regulated voltage Vreg2, and a drain terminal connected to the node 'h'. Accordingly, a voltage switching range of the pull-up element PU and the pull-down element PD can become the range of the first and second regulated voltages Vreg1 and Vreg2.

The external supply voltage VDD, which can be supplied from an external, and the ground voltage VSS, which can be sunk, can be instantaneously, or nearly instantaneously changed according to an external environment or the driving of an internal circuit. In order to reduce the load derived from the instantaneous variation of the external supply voltage VDD and the ground voltage VSS, the external supply voltage VDD and the ground voltage VSS can be regulated such that the output clock signal 'CLK_out' can be clocked with the regulated voltages (the first and second regulated voltages Vreg1 and Vreg2).

In FIGS. 4 and 5, the other inverters in the clock buffer unit 200, which are not described herein, can include pull-up elements PU and pull-down elements PD operating in a swing range similar to that of the first inverter INV1. Accordingly, detailed explanation for each of the other inverters is not provided for the sake of brevity.

Figure 6:
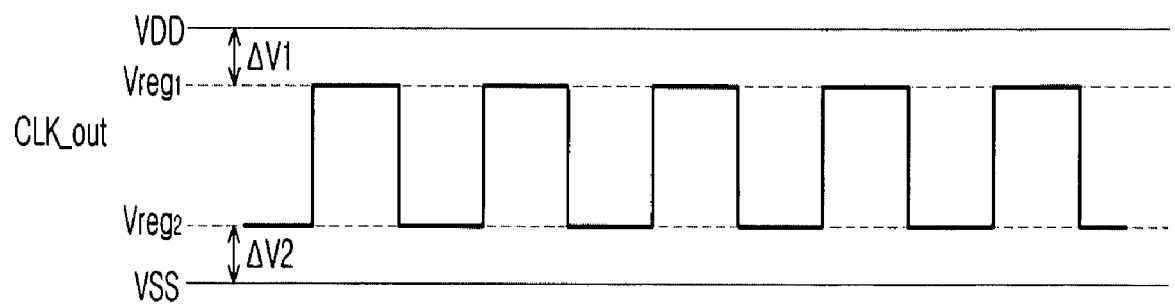
FIG. 6 is a diagram representing an exemplary voltage waveform of an output clock signal shown of FIG. 5 according to one embodiment.

FIG. 6 is a diagram representing an exemplary voltage waveform of an output clock signal shown of FIG. 5 according to one embodiment. Referring to FIG. 6, the output clock signal 'CLK_out' can have a high level corresponding to the first regulated voltage Vreg1 reduced from the external supply voltage VDD by a first predetermined voltage ($\Delta V1$). Here, a voltage source of the pull-up element PU (of FIG. 5) can become the first regulated voltage Vreg1 having a level reduced from the external supply voltage VDD. Similarly, the output clock signal 'CLK_out' can have a low level corresponding to the second regulated voltage Vreg2 boosted from the ground voltage VSS by a second predetermined voltage ($\Delta V2$). Here, a current sink of the pull-down element PD (of FIG. 5) can become the second regulated voltage Vreg2 having a level boosted from the ground voltage VSS. Accordingly, the swing range of the output clock signal 'CLK_out' can be reduced, so that the influence of the power noise, which is caused by the voltage variation of the external supply voltage VDD or the ground voltage VSS, can be reduced.

In FIG. 6, the first voltage ($\Delta V1$) may not be substantially identical to the second voltage ($\Delta V2$). Here, it is preferred that the first and second voltages ($\Delta V1$ and $\Delta V2$) have a level lower than a level of a threshold voltage of the PMOS or NMOS transistors.

As described above, a clock signal can be clocked with a voltage having regulated levels, so that power noise can be reduced from the clock signal. In addition, the influence of jitter can be reduced due to the reduction of the power noise, thereby supplying a more stable clock signal to a semiconductor memory. In addition, a control operation can be performed to reduce the swing range of the clock signal so that current consumption can be reduced.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor integrated circuit, comprising:
a first comparator that compares a first reference voltage with a first regulated voltage and outputs a first output signal;
a first driving transistor having a gate terminal for receiving the first output signal of the first comparator, a source terminal for receiving an external supply voltage and a drain terminal for outputting the first regulated voltage;
a first resistor coupled to the first driving transistor in parallel;
a second comparator that compares a second reference voltage with a second regulated voltage and outputs a second output signal;
a second driving transistor having a gate terminal for receiving the second output signal of the second comparator, a source terminal for receiving a ground voltage and a drain terminal for outputting the second regulated voltage;
a second resistor coupled to the second driving transistor in parallel; and
a clock buffer unit that supplies an output clock signal within a range of the first regulated voltage and the second regulated voltage,
wherein the first resistor drops the external supply voltage and provides a dropped voltage to the drain terminal of the first driving transistor, and the second transistor and the second resistor boost the ground voltage and provide a boosted voltage to the drain terminal of the second driving transistor.

2. The semiconductor integrated circuit of claim 1, wherein a difference between the external supply voltage and the first regulated voltage is lower than a threshold voltage of the first driving transistor.

3. The semiconductor integrated circuit of claim 1, wherein a difference between the second regulated voltage and the ground voltage is lower than a threshold voltage of the second driving transistor.

4. The semiconductor integrated circuit of claim 1, wherein the clock buffer unit includes a plurality of inverters, each comprising:

a pull-up element that employs the first regulated voltage as a voltage source; and a pull-down element that employs the second regulated voltage as a current sink.

* * * * *